(12) United States Patent
Olson

(10) Patent No.: US 8,692,609 B2
(45) Date of Patent: Apr. 8, 2014

(54) SYSTEMS AND METHODS FOR CURRENT SENSING

(75) Inventor: Chris Olson, Chicago, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 68 days.

(21) Appl. No.: 13/035,839

(22) Filed: Feb. 25, 2011

(65) Prior Publication Data

US 2012/0218003 A1    Aug. 30, 2012

(51) Int. Cl.
*G05F 1/10*     (2006.01)

(52) U.S. Cl.
USPC .......................................... 327/540; 327/108

(58) Field of Classification Search
None
See application file for complete search history.

(56) References Cited

U.S. PATENT DOCUMENTS

| | | | | |
|---|---|---|---|---|
| 4,584,662 | A * | 4/1986 | Lin | 703/4 |
| 5,939,866 | A * | 8/1999 | Bjorkengren | 323/266 |
| 6,278,294 | B1 * | 8/2001 | Taniguchi | 326/80 |
| 6,424,131 | B1 * | 7/2002 | Yamamoto et al. | 323/282 |
| 6,563,293 | B2 * | 5/2003 | Marino et al. | 323/272 |
| 6,894,465 | B2 * | 5/2005 | Sutardja et al. | 323/268 |
| 7,514,989 | B1 * | 4/2009 | Somerville et al. | 327/543 |
| 7,652,520 | B2 * | 1/2010 | Gatta | 327/436 |
| 7,956,638 | B2 * | 6/2011 | Iizuka et al. | 326/30 |
| 2009/0045677 | A1 * | 2/2009 | Frey et al. | 307/38 |
| 2009/0225484 | A1 * | 9/2009 | So | 361/93.9 |
| 2010/0295581 | A1 * | 11/2010 | Mehdizad Taleie et al. | 327/108 |
| 2011/0156762 | A1 * | 6/2011 | Tseng | 327/108 |

* cited by examiner

*Primary Examiner* — Thomas J Hiltunen
(74) *Attorney, Agent, or Firm* — Jaquez & Associates; Martin J. Jaquez, Esq.; Alessandro Steinfl, Esq.

(57) ABSTRACT

Systems and methods for current sensing are described. The described systems and methods utilize a comparator for generating a current sense signal based on comparing an output current of a circuit against a reference current. The reference current is generated by using a current sourcing circuit that is connected to a controllable current source.

22 Claims, 2 Drawing Sheets

SYSTEMS AND METHODS FOR CURRENT SENSING

BACKGROUND

1. Field

The present teachings relate to sensing current. In particular, the present teachings relate to using a comparator for sensing the amplitude of current flowing out of a circuit.

2. Description of Related Art

Current sensing can be carried out in a variety of ways. In a first approach, the current is propagated through a resistor having a known resistance value and the resulting voltage drop across the resistor is measured in order to determine the amplitude of the current flowing through the resistor. As can be appreciated this approach involves undesirable power wastage in the resistor, thereby leading to a reduction in the overall amount of power that can be provided to a load circuit.

In a second approach, an operational amplifier is configured to generate a sense signal that is proportional to the value of a current flowing through a current carrying line. While the operational amplifier approach addresses the undesired output power reduction problem associated with a current sensing resistor, this second approach also suffers from several shortcomings.

To elaborate upon this aspect, attention is drawn to FIG. 1, which shows an operational amplifier 210 configured to detect the amplitude of current flowing out a circuit 205 and into a load circuit 241. As shown, operational amplifier 210 is configured for sensing the amplitude of current flowing out of circuit 205 and into load circuit 241. Specifically, in this particular configuration, an output node 230 of circuit 205 is coupled to a negative input terminal of operational amplifier 210, and a second node (junction node 231) is coupled into the positive input terminal of operational amplifier 210. An output terminal of operational amplifier 210 is coupled to a gate terminal of an nFET 218 so as to provide feedback control to operational amplifier 210, by controlling the drain-source current flow in nFET 218. This operation will be explained below in further detail.

Junction node 231 is located between a circuit 215 and a variable impedance circuit composed of nFET 218 and resistor 219. Circuit 215, which may be used for carrying out a control function upon circuit 205 (via line 216), also constitutes an impedance that provides for current flow into nFET 218, thereby resulting in a voltage potential at junction 231.

A sense signal is derived at node 233 and coupled into control circuit 225 (via line 232). The sense signal is indicative of the amplitude of current flowing into load circuit 241 from circuit 205, and is used by control circuit 225 to generate suitable control signals for controlling various elements (not shown) inside circuit 205, thereby controllably modifying the amplitude of current flowing out of circuit 205 into load circuit 241.

As mentioned above, the use of operational amplifier 210 does indeed address the undesired output power reduction problem associated with power dissipation in a current sensing resistor. However, the operational amplifier solution also suffers from several handicaps.

The first handicap pertains to the bandwidth requirement of operational amplifier 210. Typically, for effective operation of the feedback circuit configuration shown in FIG. 1, the bandwidth of operational amplifier 210 has to be selected to be at least one order of magnitude higher than the bandwidth of the AC signal present at junction node 230 in order to produce a desired gain. For example, if the frequency of the AC signal provided to the non-inverting terminal of operational amplifier 210 (from junction node 230) is around 25 MHz, operational amplifier 210 has to be selected to have a bandwidth of around 250 MHz (i.e., a decade multiple of the input AC frequency). This large bandwidth requirement places an undesirable limitation on the type of operational amplifier that can be used in current sensing circuit 220, consequently curtailing choices of operational amplifiers to a limited sub-set of devices amongst a plurality of available devices.

The second handicap pertains to power consumption. The large bandwidth of operational amplifier 210 leads to an increase in power consumption, thereby leading to an undesirable increase in demand upon the power supply. The increased power consumption also leads to other problems such as thermal issues and increased real estate requirements on a substrate of an integrated circuit, for example.

The third handicap pertains to stability issues associated with large bandwidth operational amplifiers. The large bandwidth of operational amplifier 210 can lead to unstable circuit performance, especially when the gain of the circuit is increased beyond a certain level. Consequently, the selection of the type of components used, as well as circuit design and layout aspects, become critical issues.

Several other handicaps associated with large bandwidth operational amplifiers include factors such as cost, availability, and packaging constraints.

SUMMARY

According to a first aspect of the present disclosure, a method for sensing current is provided. The method includes: generating an output current from a first circuit; generating a variable reference current by using a current sourcing circuit connected in series with a controllable current source; coupling into a first input node of a comparator, an output voltage signal that is generated from the first circuit, wherein the output voltage signal varies in accordance with the output current generated by the first circuit; coupling into a second input node of the comparator, a reference voltage signal that is generated at a reference node located between the current sourcing circuit and the controllable current source; and adjusting the controllable current source to set the reference voltage signal at a desired voltage level in order to compare the reference voltage signal to the output voltage signal, and generate therefrom, a current sense signal.

According to a second aspect of the disclosure, a current sensing system is provided. The system includes a first circuit configured to provide an output current at a first amplitude, and also includes a control circuit. The control circuit comprises a current sourcing circuit; a controllable current source operable to set a desired reference current flowing through the current sourcing circuit; and a comparator having a first input node configured to receive a first output voltage corresponding to the first amplitude of the output current, a second input node configured to receive a reference voltage that corresponds to the desired reference current, and an output node configured to provide a current sense signal.

According to a third aspect, a current sensing system is provided. The system includes a plurality of cells located inside an integrated circuit; and also includes a unit sense cell, that has a current sourcing circuit; a controllable current source operable to set a desired reference current flowing through the current sourcing circuit; and a comparator having a first input node configured to receive a first voltage that varies in accordance with an output current drawn from the plurality of cells, a second input node configured to receive a reference voltage that varies in accordance with the desired reference current, and an output node that provides a current sense signal.

Further aspects of the disclosure are shown in the specification, drawings and claims of the present application.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as, for example, field-effect transistors, nodes, terminals, voltage drops, circuits, applied to, connections, and coupling are used herein as a matter of convenience for description purposes and should not be interpreted literally in a narrowing sense. For example, a node may be alternatively referred to as a terminal in this disclosure. A person of ordinary skill in the art will understand that these two terms are similar and must be interpreted accordingly. It will be also be understood that the drawings use certain symbols and interconnections that must be interpreted broadly as can be normally understood by persons of ordinary skill in the art. As one example, of such interpretation, the supply voltages shown in the figures indicate P-type devices and N-type devices that are coupled to a positive supply voltage and a ground terminal. A person of ordinary skill in the art will recognize that the P-type and N-type devices can be based on different technologies and types. The devices can be interconnected in various different ways, and the polarities, as well as connectivity, of the power supply voltages can be suitably tailored to these various circuit configurations without detracting from the spirit of the disclosure.

In particular, current sensing systems and methods for use in a circuit containing one or more cascode stacks are described herein. As can be understood by one of ordinary skill in the art, the described cascode stack configuration can be incorporated into a wide variety of devices such as, for example, a DC-to-DC converter, a power amplifier, or an operational amplifier. Furthermore, the current sensing methods and systems described herein can be applied to a variety of circuits and are not limited to the cascode stack configuration that is used herein as a matter of convenience for purposes of description (especially in connection with the use of a replica circuit). The use of the comparator circuit for current sensing in applications other than a cascode stack circuit can be reasonably understood by one of ordinary skill in the art from the principles described herein in this document.

Figure 1:
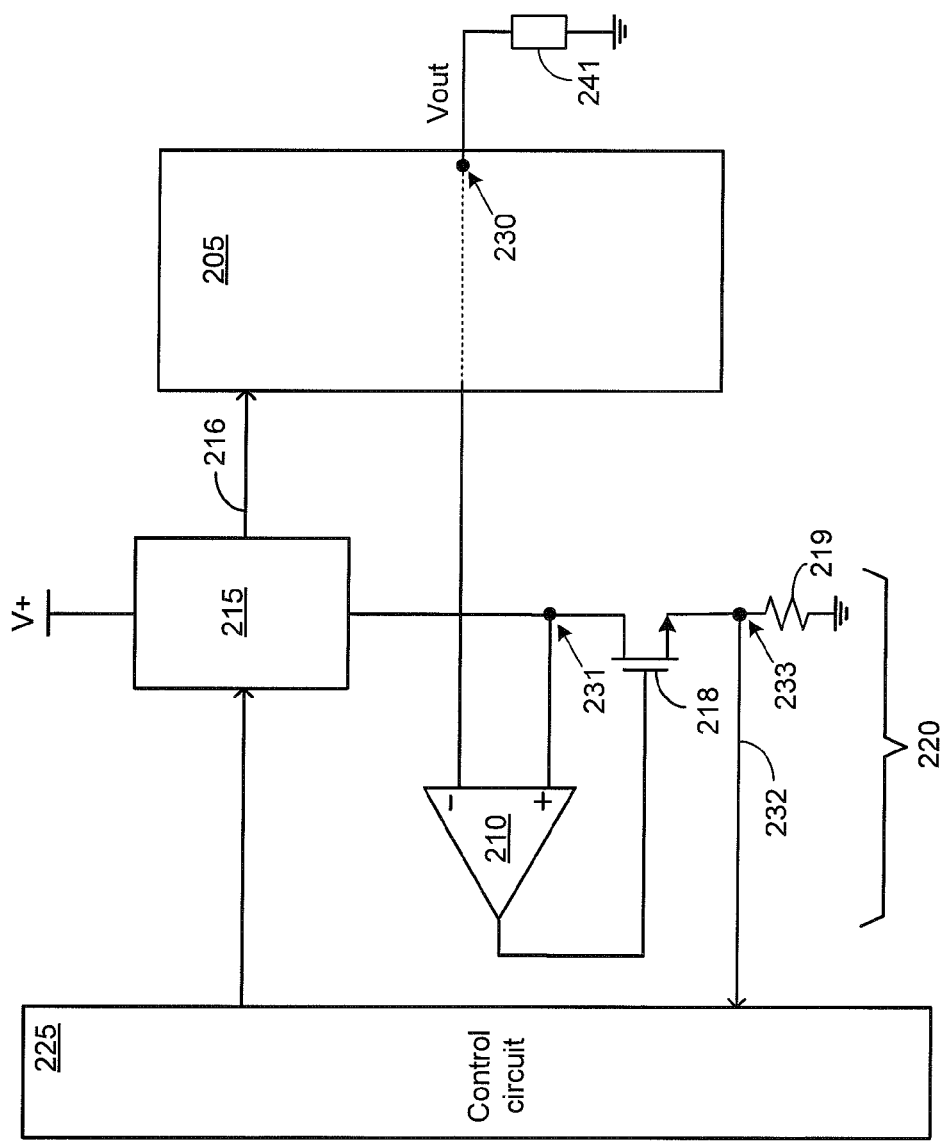
FIG. 1 shows a prior art configuration that uses an operational amplifier for current sensing.
Figure 2:
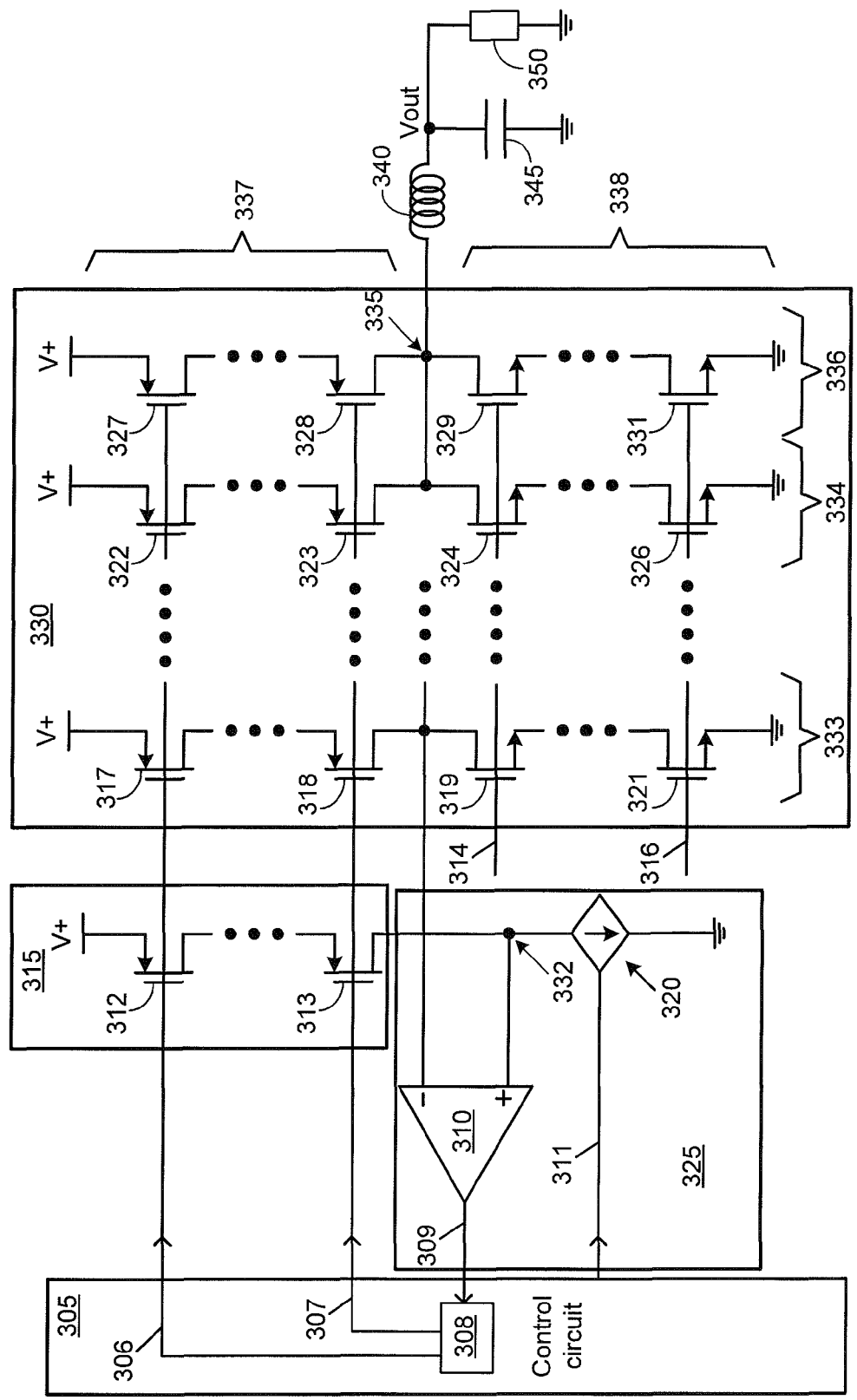
FIG. 2 shows a circuit that uses a comparator for sensing current, in accordance with the teachings of the present disclosure.

Attention is now drawn to FIG. 2, which shows a comparator 310 configured to detect the amplitude of current flowing out a circuit 330 and into a load circuit 350.

Circuit 330 contains a plurality of sub-circuits referred to herein as cells. Each cell includes a cascode stack. Three such cells are shown in FIG. 2 as examples. The first cell 333 includes transistors 317, 318, 319 and 321 arranged as a first cascode stack. The second cell 334 includes transistors 322, 323, 324 and 326 arranged as a second cascode stack. The third cell 336 includes transistors 327, 328, 329 and 331 arranged as a third cascode stack. Each cascode stack has an upper leg 337 and a lower leg 338. The upper and lower legs are connected to each other at a junction node (e.g. junction node 335 of stack 336). The junction nodes of each of the stacks are interconnected together as shown, in order to provide a concatenated output current that has an amplitude equal to the sum of the individual stack currents.

The gate terminals of each row of transistors in circuit 330 are also interconnected as shown, such that a gate drive signal can be applied simultaneously to all the gate terminals of a row. For example, a first gate drive signal transmitted via line 306 from control circuit 305, is used to simultaneously drive the first row of transistors 317, 322 and 327 in circuit 330. Similarly, a second gate drive signal transmitted via line 307 from control circuit 305, is used to simultaneously drive the second row of transistors 318, 323 and 328 in circuit 330; a third gate drive signal transmitted via line 314 from control circuit 305 (connection not shown), is used to simultaneously drive the third row of transistors 319, 324 and 329; and a fourth gate drive signal transmitted via line 316 from control circuit 305 (connection not shown), is used to simultaneously drive the fourth row of transistors 321, 326 and 331.

It will be understood that circuit 330 can include any number of rows and columns depending on several factors. These factors include, for example, the $V_{DS}$ stress voltage that can be withstood by the individual transistors (determines the number of transistors located in each leg); and a desired output current (determines the number of stacks to be used in circuit 330). Some of these factors are explained below in further detail.

Each of the upper leg and the lower leg, in each individual stack contains "n" number of devices, where "n" is selected based on the applied supply voltage. For example, if the desired $V_{DS}$ drop in each of the devices is around 4 volts and the supply voltage is +12V with reference to ground, three such devices can be connected in series so as to evenly distribute the 12V potential across the three devices in each leg. In the example circuit 330, upper leg 337 contains three P-type field effect transistors (pFETs); while lower leg 338 contains three N-type field effect transistors (nFETs). In other applications, the number "n" of transistors placed in each leg can be varied depending on the characteristics of the power supply voltage.

In operation, upper leg 337 is first placed in a conducting state, while lower leg 338 is placed in a non-conducting state. This first operation is carried out by providing switch drive signals from control circuit 305 to place each of the pFETs in upper leg 337 in a conducting state, and by placing each of the nFETS in lower leg 338 in a non-conducting state. As a result of this first operation, junction node 335 is at a V+ voltage level (minus the substantially negligible voltage drops across each of the pFETs in upper leg 337 that are in the conducting state).

At a subsequent period of time, upper leg 337 is placed in a non-conducting state while lower leg 338 is placed in a conducting state. This second operation is carried out by providing switch drive signals from control circuit 305 to place each of the pFETs in upper leg 337 in a non-conducting state, and by placing each of the nFETS in lower leg 338 in a conducting state. As a result of this second operation, junction node 335 is placed at a ground level potential (the voltage drops across each of the nFETs in lower leg 338 in the conducting state are substantially negligible).

The upper and lower legs are then cycled through the two operations described above, thus resulting in a pulse signal (AC signal) appearing at junction node 335. This pulse signal may then be propagated through a low pass filter composed of inductor 340 and capacitor 345 in order to create a DC output voltage that is provided to load circuit 350. The low pass filter is used when the cascode circuit is a part of a DC-to-DC converter. However, in other applications, the low pass filter may be omitted if an AC signal output is to be impressed upon load circuit 350 instead.

As can be understood, the AC or DC current drawn out of circuit 330 is proportional to the impedance value of load circuit 350. Specifically, the amplitude of the voltage present at junction node 335 varies inversely with the amplitude of the current drawn out of circuit 330 by load 350 when the top leg 337 is conducting. Consequently, in a voltage vs. current graph, the voltage amplitude will have a negative slope, in comparison to a positive slope of the current amplitude. A threshold value may be selected (corresponding to a specific current amplitude) by using this graph.

As one example, the threshold value may be set at an intersection point of the voltage and current plots. As another example, the threshold value may be set at a certain current amplitude that is determined to be a threshold current sense point at which a control action needs to be carried out. Some non-limiting examples of a suitable control action when the current amplitude reaches (or exceeds) the threshold current sense point include: a shutdown operation carried out upon circuit 330; generation of a over-current warning signal; and/or providing a voltage boost operation in circuit 330 to compensate for the increase in current demand.

Conversely, the threshold value may be set at a certain voltage amplitude that is determined to be a threshold voltage sense point at which a control action is to be carried out. A non-limiting example of a suitable control action when the voltage amplitude reaches or exceeds the threshold voltage sense point (possibly as a result of reduced current demand, or a circuit failure) includes providing a bucking action in circuit 330. Such an action may be applicable for example, in a DC-DC buck converter.

Further details pertaining to detecting a threshold sense point, specifically a threshold current sense point, and generating therefrom, a current sense signal for carrying out a control action will now be explained. Towards this end, attention is once again drawn to FIG. 2 wherein a current sensing circuit (referred to herein, as a unit sense cell 325) is shown.

Unit sense cell 325 includes a comparator 310, amongst several elements that are described below in more detail. In contrast to an operational amplifier, a comparator inherently provides very high gain and also provides an output signal that can switch rapidly from one logic state to an opposing logic state in response to a differential change in input signal amplitudes.

Typically, in comparison to an operational amplifier, a comparator circuit does not suffer from issues related to stability (e.g. oscillations), thermal dissipation, and certain power supply constraints. Furthermore, unlike an operational amplifier circuit, a comparator circuit does not require an external feedback circuit with associated handicaps such as a reduction in bandwidth (lower rise/fall times and slower slew rate), the need for careful selection of other components, layout issues to avoid oscillations, real estate requirements etc.

In the example configuration shown in FIG. 2, junction node 335 is coupled to a first input terminal of comparator 310, junction node 332 is coupled into a second input terminal of comparator 310, and an output terminal of comparator 310 is coupled into control circuit 305. It will be understood that the first and second input terminals (positive and negative inputs) can be interchangeably selected for connecting to junction nodes 335 and 332, in order to provide an appropriate direction of signal swing at the output terminal of comparator 310. Junction node 332 is located between a current sourcing circuit and a variable current source 320. The current sourcing circuit is exemplified in the form of a replica circuit 315 that is used in the description herein. However, it will be understood that in some alternative embodiments, the current sourcing circuit may be implemented in various configurations other than in the form of a replica circuit.

In a first embodiment, current sourcing circuit is a replica circuit 315 that is formed of pFET devices 312 through 313, which replicate an upper leg 337 in any one individual stack in circuit 330. The pFET devices 312 through 313 are located in the same substrate as the stacks in circuit 330. This arrangement of using the same substrate material for forming all the pFETs ensures that the operating characteristics of pFETs 312 through 313 automatically matches the operating characteristics of the pFET devices in any of the individual stacks in circuit 330. This automatic matching arrangement eliminates the need to expressly tailor the characteristics of pFETs 312 through 313 to the characteristics of pFETs contained in circuit 330. As can be understood, express tailoring is undesirable because it would involve complicated procedures and yet may lead to an imperfect match (for example, when pFETs 312 through 313 are selected to be a part of a separate substrate, or, are discrete components that are not a part of an integrated circuit in which circuit 330 is located).

In a second embodiment (not shown), replica circuit 315 is formed of nFET devices that replicate a lower leg 338 in any one individual stack in circuit 330. Here again, it is preferable that these nFET devices are located in the same substrate as the stacks in circuit 330 so as to provide automatic matching of device operating characteristics.

In a third embodiment (not shown), replica circuit 315 is formed of devices other than FETs. These devices replicate one or more devices in one or the other of the upper and lower legs in any one individual stack in circuit 330. Such devices may include resistors, capacitors, diodes, and other components.

Irrespective of which embodiment is used, replica circuit 315 is specifically selected to have an impedance value that is a known fraction of the impedance value of all the current conducting stacks contained in circuit 330. To elaborate on this aspect, let be assumed for purposes of description, that replica circuit 315 is formed of pFET devices 312 through 313 that replicate an upper leg 337 in any one individual stack in circuit 330. Let it be further assumed that circuit 330 contains ten thousand upper legs 337. The ten thousand upper legs correspond to ten thousand current-carrying cascode stacks that are formed on a substrate of an integrated circuit. As pointed out above, the junction nodes of each of the individual cascode stacks are interconnected together as shown, in order to provide a concatenated output current via junction node 335, having an amplitude equal to the sum of the individual stack currents. Consequently, for example, if the concatenated output current is equal to 10 Ampere, each individual cascode stack provides 1 mA (i.e. 10 A/10K=1 mA).

To achieve the same 1 mA current draw through replica circuit 315, a bottom end of replica circuit 315 is connected to a variable current source 320 (thereby creating junction node 332), and a top end of replica circuit 315 is connected to the same power supply (V+) as provided to circuit 330. A suitable drive signal is provided (from control circuit 305 via line 311) to the variable current source 320 in order to configure variable current source 320 for drawing current (1 mA in the example described above) through replica circuit 315. The current flowing through replica circuit 315 is a scaled-down version of the concatenated output current (i.e. 1/x times the output current; where x=10K in the example above), and can consequently be used as a reference current for comparison purposes in comparator 310.

As can be appreciated, though comparator 310 carries out a voltage comparison function between the voltages present at junction node 335 and junction node 332, this voltage comparison is in effect a current comparison operation because the two voltages reflect the amount of current flowing through each of the two respective nodes. In other words, the voltage present at junction node 335 provides an indication of the amplitude of the output current drawn by load circuit 350 from circuit 330 (a higher voltage represents a lower output current draw, and a lower voltage represents a higher output current draw). Similarly, the voltage present at junction node 332 provides an indication of the amplitude of the reference current drawn by variable current source 320 through replica circuit 315. It will be understood that in this particular embodiment, the voltages present at each of junction nodes 335 and 332 are AC signals. The AC signal at junction node 335 (as a result of the switching action between upper and lower legs of the cascode circuit) has been described above.

As for the AC signal at junction node 332, control circuit 305 drives the gate terminal of transistor 312 with the same first gate drive signal (switching signal transmitted via line 306 from control circuit 305) as is used to simultaneously drive the first row of transistors 317, 322 and 327 in circuit 330. Similarly, control circuit 305 drives the gate terminal of transistor 313 with the same second gate drive signal (switching signal transmitted via line 307 from control circuit 305) as is used to simultaneously drive the second row of transistors 318, 323 and 328 in circuit 330. This results in the AC signal being present at junction node 332.

Comparator 310 carries out a comparison of the amplitudes of the two AC signals and generates an output signal based on the difference between the two. This output signal is provided to control circuit 305 via line 309 where it is processed by a suitable logic circuit 308 in order to generate the first and second gate drive signals carried on lines 306 and 307. Control circuit 305 also provides gate drive signals to each row of nFETs in lower leg 338 of circuit 330. While the connections are not shown in FIG. 2, it will be understood that the gate drive signals are provided via lines 314 and 316.

In an alternative embodiment (not shown) to the configuration of FIG. 2, the pFET devices used in replica circuit 315 are replaced with nFET devices. These nFET devices replicate a lower leg 338 in any one individual stack in circuit 330. In terms of the characteristics of this alternative replica circuit, the remarks provided above vis-à-vis the pFET device configuration are equally applicable to this embodiment as well. It will be specifically understood that the current flowing through the pFET replica is a scaled-down version of the concatenated output current (i.e. 1/m times the output current). As can be understood by persons of ordinary skill in the art, this alternative replica circuit may be interconnected with comparator 310 in a different way in order to accommodate voltage polarity, current flow direction in variable current source 320, and other requirements.

In summary, a number of embodiments of the present inventive concept have been described above. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A method for sensing current, comprising:
generating an alternating current (AC) voltage signal at an interconnected junction node of "N" cascode stacks, wherein the value of "N" is selected on the basis of defining a reference current that is "1/N" times the magnitude of an output current provided out of the interconnected junction node;
generating the output current by coupling a proximal end of a load to the interconnected junction node and a distal end of the load to a ground node;
generating the reference current in a replica circuit that includes a duplicate one of an upper leg or a lower leg of any one cascode stack amongst the "N" cascode stacks, the duplicate one of an upper leg or a lower leg automatically sourcing the reference current at "1/N" times the magnitude of the output current;
coupling into a first input node of a comparator, the AC voltage signal generated at the interconnected junction node;
coupling into a second input node of the comparator, a reference voltage signal that is generated by using the reference current that is generated by the replica circuit; and
adjusting a controllable current source that is coupled to the replica circuit to set the reference voltage signal at a desired voltage level in order to compare the reference voltage signal to the AC voltage signal and generate therefrom, a current sense signal.

2. The method of claim 1, wherein the current sense signal is a monitor signal for indicating a condition of the output current.

3. The method of claim 1, wherein a gate node of at least a first field-effect transistor in the replica circuit is connected to a gate node of each corresponding field-effect transistor in each of the "N" cascode stacks.

4. The method of claim 1, wherein each of a first set of field-effect transistors in the upper leg is a p-channel field-effect transistor and each of a second set of field-effect transistors in the lower leg is an n-channel field-effect transistor.

5. The method of claim 4, wherein the first set of field-effect transistors is configured via a first drive signal and the second set of field-effect transistors is configured via a second drive signal that is provided substantially concurrently to the first drive signal.

6. The method of claim 1, further comprising inserting a filter between the interconnected junction node and the proximal end of the load.

7. The method of claim 1, wherein the upper leg of each cascode stack amongst the "N" cascode stacks comprises a first plurality of field effect transistors configured in a first series connection, and the lower leg of each cascode stack amongst the "N" cascode stacks comprises a second plurality of field effect transistors configured in a second series connection, and further wherein the interconnected junction node is formed by interconnecting each junction node located between an upper leg and a lower leg of each of the "N" cascode stacks.

8. The method of claim 7, wherein generating the AC voltage signal comprises:

driving the output current through the load to the ground node by raising the interconnected junction node to a supply voltage potential for a first period of time; and stopping flow of the output current to the ground node by pulling the interconnected junction node to a ground potential for a second period of time.

9. The method of claim 8, wherein raising the interconnected junction node to the supply voltage potential comprises driving each field-effect transistor in each of the upper legs to operate in a conducting state and placing each field-effect transistor in each of the lower legs to operate in a non-conducting state.

10. The method of claim 9, wherein pulling the interconnected junction node to the ground potential comprises driving each field-effect transistor in each of the lower legs to operate in a conducting state and placing each field-effect transistor in each of the upper legs to operate in a non-conducting state.

11. The method of claim 10, wherein the AC voltage signal varies in amplitude between the supply voltage potential and the ground potential.

12. A current sensing system comprising:
a first circuit comprising:
"N" cascode stacks, each having an upper leg that includes a first plurality of field-effect transistors of a first channel type and a lower leg that includes a second plurality of field-effect transistors of a second channel type that is different than the first channel type;
an interconnected junction node formed by interconnecting each junction node located between the upper and lower legs of each of the "N" cascode stacks; and
an interconnected gate connection formed by interconnecting a gate terminal of each of the first plurality of field-effect transistors;
a replica circuit comprising a duplicate one of the first plurality of field-effect transistors, the gate terminal of the duplicate one of the first plurality of field-effect transistors connected to the interconnected gate connection; and
a control circuit, comprising logic circuitry for providing a first switch drive signal to the interconnected gate connection for placing the first plurality of field effect transistors in one of a conducting switch state or a non-conducting switch state, and a second switch drive signal that places the second plurality of field effect transistors in an opposing switch state to the one of the conducting switch state or the non-conducting switch state, wherein the first and second drive signals are provided over intervals of time selected to generate an alternating current (AC) signal at the interconnected junction node, the AC signal varying in amplitude from a supply voltage potential to a ground potential in accordance with providing of the first and second switch drive signals.

13. The current sensing system of claim 12, wherein the replica circuit is configured by the control circuit to generate a reference current having an amplitude that is an integer sub-multiple of an output current provided to a load circuit from the interconnected junction node.

14. The current sensing system of claim 13, wherein the desired reference current is measured in milliamperes and the output current is measured in amperes.

15. The current sensing system of claim 13, wherein the first circuit, the replica circuit, and the control circuit are contained inside an integrated circuit.

16. The current sensing system of claim 15, further comprising a controllable current source that is adjusted for setting the reference current to a value that results in an amplitude of the output current staying lower than a maximum current rating of the integrated circuit.

17. The current sensing system of claim 16, wherein the controllable current source is controlled by a control signal provided by a voltage control loop circuit.

18. The current sensing system of claim 17, wherein the voltage control loop circuit is contained inside the integrated circuit.

19. A current sensing system comprising:
a plurality of cells located inside an integrated circuit, wherein each cell comprises an upper leg containing a first series-connected plurality of field-effect transistors and a lower leg containing a second series-connected plurality of field-effect transistors, and further wherein each gate terminal of each of the first field effect transistors in a first row of the plurality of cells are interconnected to form a first interconnected gate connection, and each gate terminal of each of the second field effect transistors in a second row of the plurality of cells are interconnected to form a second interconnected gate connection;
a replica circuit comprising a duplicate of one of the first series-connected plurality of field-effect transistors or the second series-connected plurality of field-effect transistors;
a unit sense cell coupled to the replica circuit, the unit sense cell comprising:
a controllable current source operable to set a desired reference current flowing through the replica circuit; and
a comparator having a first input node configured to receive a first voltage that varies in accordance with an output current drawn from an interconnected junction node in the plurality of cells, a second input node configured to receive a reference voltage that varies in accordance with the desired reference current, and an output node that provides a current sense signal; and
a control circuit configured to receive the current sense signal and process the current sense signal to derive a first switch drive signal for driving the first interconnected gate connection to place each of the first field effect transistors in the first row in one of a conducting switch state or a non-conducting switch state, and a second switch drive signal for driving the second interconnected gate connection to place each of the second field effect transistors in the second row in an opposing switch state to the one of the conducting switch state or the non-conducting switch state of the first field-effect transistors in the first row, wherein the first and second drive signals are provided over intervals of time selected to generate an alternating current (AC) signal at the interconnected junction node, the AC signal varying in amplitude from a supply voltage potential to a ground potential.

20. The current sensing system of claim 19, wherein the replica circuit and the controllable current source are configured in a series connection that provides the desired reference current.

21. The current sensing system of claim 19, wherein the desired reference current has an amplitude that is smaller than the output current drawn from the plurality of cells by a factor that corresponds to a first number of cells contained in the plurality of cells.

22. The current sensing system of claim 21, wherein the first number of cells is substantially equal to ten thousand.

\* \* \* \* \*